United States Patent
Ramanathan et al.

(10) Patent No.: US 11,515,205 B2
(45) Date of Patent: Nov. 29, 2022

(54) CONDUCTIVE STRUCTURES FOR CONTACTING A TOP ELECTRODE OF AN EMBEDDED MEMORY DEVICE AND METHODS OF MAKING SUCH CONTACT STRUCTURES ON AN IC PRODUCT

(71) Applicant: GLOBALFOUNDRIES U.S. Inc., Santa Clara, CA (US)

(72) Inventors: Eswar Ramanathan, Mechanicville, NY (US); Sunil Kumar Singh, Mechanicville, NY (US); Xuan Anh Tran, Clifton Park, NY (US); Suryanarayana Kalaga, Austin, TX (US); Juan Boon Tan, Singapore (SG)

(73) Assignee: GlobalFoundries U.S. Inc., Santa Clara, CA (US)

( * ) Notice: Subject to any disclaimer, the term of this patent is extended or adjusted under 35 U.S.C. 154(b) by 9 days.

(21) Appl. No.: 16/556,465

(22) Filed: Aug. 30, 2019

(65) Prior Publication Data
US 2021/0066126 A1 Mar. 4, 2021

(51) Int. Cl.
*H01L 21/768* (2006.01)
*H01L 27/22* (2006.01)
(Continued)

(52) U.S. Cl.
CPC .. *H01L 21/76897* (2013.01); *H01L 27/11507* (2013.01); *H01L 27/228* (2013.01);
(Continued)

(58) Field of Classification Search
CPC ......... H01L 21/76897; H01L 27/11507; H01L 27/228; H01L 27/2436; H01L 43/02; H01L 43/12; H01L 45/1233; H01L 45/1253
See application file for complete search history.

(56) References Cited

U.S. PATENT DOCUMENTS

2007/0045687 A1* 3/2007 Kumura ................. H01L 28/65
257/295
2007/0172964 A1 7/2007 Yen et al.
(Continued)

OTHER PUBLICATIONS

Kozicki and Barnaby, "Conductive bridging random access memory—materials, devices and applications," Semicond. Sci. Technol., 31:113001, 2016.
(Continued)

*Primary Examiner* — Vongsavanh Sengdara
(74) *Attorney, Agent, or Firm* — Yee Tze Lim; Hoffman Warnick LLC

(57) ABSTRACT

One illustrative method disclosed herein includes forming at least one first layer of insulating material above an upper surface of a top electrode of a memory cell, forming a patterned etch stop layer above the at least one first layer of insulating material, wherein the patterned etch stop layer has an opening that is positioned vertically above at least a portion of the upper surface of the top electrode and forming at least one second layer of insulating material above an upper surface of the etch stop layer. The method also includes forming a conductive contact opening that extends through the etch stop layer to expose at least a portion of the upper surface of the top electrode and forming a conductive contact structure in the conductive contact opening, wherein the conductive contact structure is conductively coupled to the upper surface of the top electrode.

16 Claims, 18 Drawing Sheets

(51) Int. Cl.
   *H01L 43/02*   (2006.01)
   *H01L 43/12*   (2006.01)
   *H01L 27/11507*   (2017.01)
   *H01L 45/00*   (2006.01)
   *H01L 27/24*   (2006.01)

(52) U.S. Cl.
   CPC .......... *H01L 27/2436* (2013.01); *H01L 43/02* (2013.01); *H01L 43/12* (2013.01); *H01L 45/1233* (2013.01); *H01L 45/1253* (2013.01); *H01L 45/16* (2013.01)

(56) References Cited

U.S. PATENT DOCUMENTS

| | | |
|---|---|---|
| 2009/0091038 A1 | 4/2009 | Chen et al. |
| 2009/0261433 A1 | 10/2009 | Kang et al. |
| 2012/0032287 A1 | 2/2012 | Li et al. |
| 2013/0264620 A1* | 10/2013 | Yu .................... H01L 27/11509 438/653 |
| 2014/0131651 A1 | 5/2014 | Tu et al. |
| 2015/0171314 A1 | 6/2015 | Li et al. |
| 2016/0071905 A1* | 3/2016 | Park ........................ G06F 3/061 711/104 |
| 2016/0093668 A1 | 3/2016 | Lu et al. |
| 2016/0133828 A1 | 5/2016 | Lu et al. |
| 2017/0256449 A1* | 9/2017 | Zhang ............... H01L 21/76883 |
| 2018/0061482 A1* | 3/2018 | Zhao ................... G11C 11/1673 |
| 2020/0075669 A1* | 3/2020 | Chuang ................. H01L 43/02 |
| 2020/0075857 A1* | 3/2020 | Chou ................. H01L 45/1675 |

OTHER PUBLICATIONS

Li et al., "An overview of resistive random access memory devices," Chinese Science Bulletin, 56:3072-78, Oct. 2011.

* cited by examiner

CONDUCTIVE STRUCTURES FOR CONTACTING A TOP ELECTRODE OF AN EMBEDDED MEMORY DEVICE AND METHODS OF MAKING SUCH CONTACT STRUCTURES ON AN IC PRODUCT

BACKGROUND OF THE INVENTION

Field of the Invention

The present disclosure generally relates to the fabrication of integrated circuits, and, more particularly, to various embodiments of novel conductive structures for forming a conductive contact structure to a top electrode of an embedded memory device and various novel methods of making such conductive contact structures on an integrated circuit (IC) product.

Description of the Related Art

In many modern integrated circuit products, embedded memory devices and logic circuits (e.g., microprocessors) are formed on the same substrate or chip. Such embedded memory devices may come in a variety of forms, e.g., an MTJ (magnetic tunnel junction) memory device, an RRAM (resistive random access memory) device, a PRAM (phase-change random access memory) device, an MRAM (magnetic random access memory) device, a FRAM (ferroelectric random access memory) device, etc. Typically, all of the embedded memory devices have a top electrode to which a conductive contact structure must be formed for the device to be operational.

Various techniques have been employed to try to form such a conductive contact structure to the top electrode of such a memory device. Typically, after the top electrode is formed, it is covered by one or more layers of insulating material and one or more etch stop layers. At some point during the process flow, the upper surface of the top electrode must be exposed to allow for formation of the conductive contact structure that is conductively coupled to the top electrode. One technique involves etching a trench into the layer of insulating material and/or etch stop layers so as to expose or "reveal" the top electrode. This necessitates that the bottom of the trench extend past the upper surface of the top electrode. One problem with this technique is that it typically requires that the top electrode be made relatively thicker so as to provide an increased process window and reduce the chances of the trench exposing other parts of the memory device, leading to the creation of an undesirable electrical short that would render the memory device inoperable. Another manufacturing technique that is commonly employed involves directly patterning (via masking and etching) a via that is positioned and aligned so as to expose the upper surface of the top electrode. One problem with this approach is the fact that, as device dimensions continue to shrink, it is very difficult to properly align the via such that it only exposes a portion of the upper surface of the top electrode. Any misalignment of the via relative to the top electrode can result in undesirable exposure of the sidewalls of the top electrode, which can also lead to undesirable electrical shorts and device inoperability. Additionally, these processing steps lead to higher manufacturing costs and require the use of additional masking layers. Lastly, incarnate lateral positioning of the conductive via that contacts the top electrode of the memory cell can lead to limited spacing between the conductive via and other conductive structures, such as one or more conductive lines positioned adjacent the conductive via that contacts the top electrode. Such limited spacing reduces process windows for forming such conductive vias and may lead to undesirable shorts between such conductive vias and other conductive structures positioned laterally adjacent the conductive via that contacts the top electrode of the memory cell.

The present disclosure is generally directed to various embodiments of novel conductive structures for forming a conductive contact structure to a top electrode of an embedded memory device and various novel methods of making such conductive contact structures on an IC product that may at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a conductive contact structure to a top electrode of an embedded memory device on an IC product and an IC product having such a novel corresponding configuration. One illustrative method disclosed herein includes forming at least one first layer of insulating material above an upper surface of the top electrode, forming a patterned etch stop layer above the at least one first layer of insulating material, wherein the patterned etch stop layer has an opening that is positioned vertically above at least a portion of an upper surface of the top electrode, and forming at least one second layer of insulating material above an upper surface of the etch stop layer, wherein the at least one second layer of insulating material fills the opening in the etch stop layer. In this example the method also includes forming a conductive contact opening that extends through the at least one second layer of insulating material, the opening in the etch stop layer and at least a portion of the at least one first layer of insulating material, wherein the conductive contact opening exposes at least a portion of the upper surface of the top electrode, and forming a conductive contact structure in the conductive contact opening, wherein the conductive contact structure is conductively coupled to the upper surface of the top electrode.

Another illustrative method disclosed herein includes forming a memory cell, wherein the memory cell includes a top electrode and a layer of sacrificial material positioned above an upper surface of the top electrode, forming at least one first layer of insulating material above an upper surface of the layer of sacrificial material and forming an etch stop layer above the at least one first layer insulating material. In this example, the method also includes forming at least one second layer of insulating material above an upper surface of the etch stop layer, forming a conductive contact opening that extends through the at least one second layer of insulating material and the etch stop layer so as to expose at least a portion of the upper surface of the layer of sacrificial material and removing at least a portion of the layer of sacrificial material so as to expose at least a portion of the upper surface of the top electrode and extend a depth of the conductive contact opening. Thereafter, the method involves forming a conductive contact structure in the conductive contact opening, wherein the conductive contact structure is conductively coupled to the upper surface of the top electrode.

One illustrative IC product disclosed herein includes a first metallization layer and a memory cell positioned in the first metallization layer, wherein the memory cell includes a top electrode having an upper surface that is positioned at a first level within the first metallization layer relative to a reference surface located below the first metallization layer. In this example, the IC product also includes a conductive line positioned in the first metallization layer, wherein the conductive line has a bottom surface that is positioned at a second level within the first metallization layer relative to the reference surface, wherein the first level is above or approximately even with the second level, and a conductive contact structure that is conductively coupled to the upper surface of the top electrode.

BRIEF DESCRIPTION OF THE DRAWINGS

The disclosure may be understood by reference to the following description taken in conjunction with the accompanying drawings, in which like reference numerals identify like elements, and in which.

Figure 1:
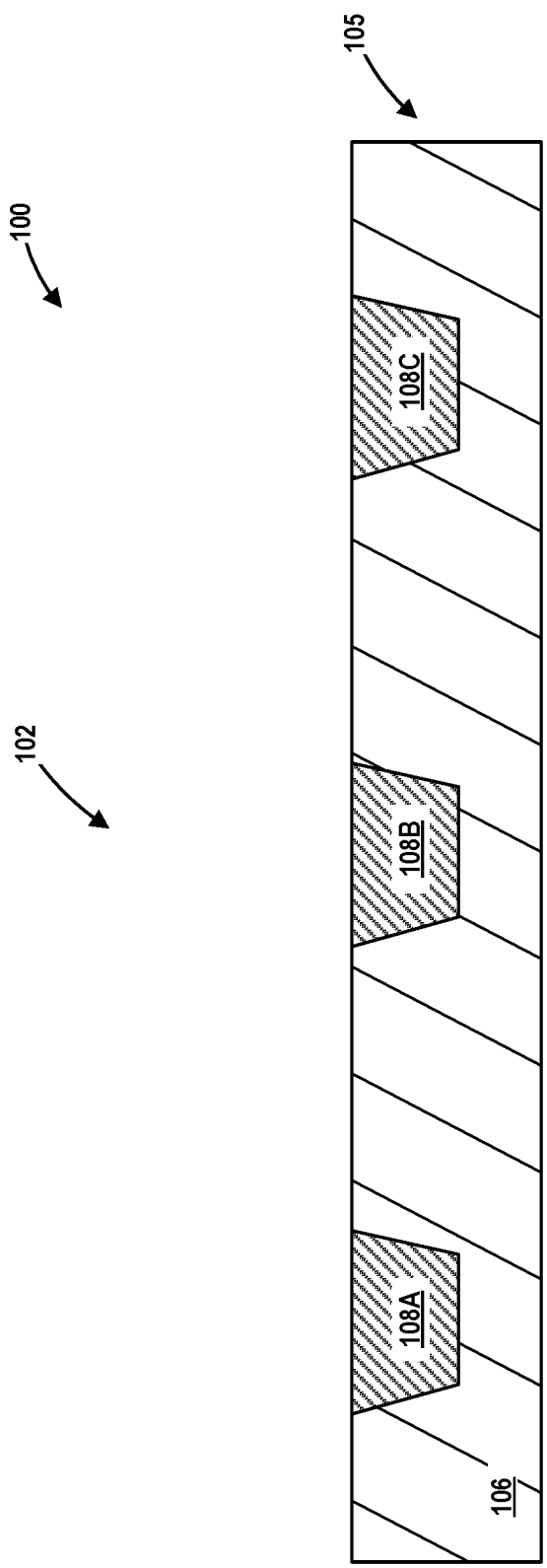
FIGS. 1-11 depict one illustrative method of forming one illustrative embodiment of a novel conductive contact structure that is conductively coupled to a top electrode of an embedded memory device on an IC product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-11 depict one illustrative method of forming one illustrative embodiment of a novel conductive contact structure that is conductively coupled to a top electrode of an embedded memory device on an IC product 100 and an IC product 100 having such a novel corresponding configuration. The IC product 100 will be formed on and above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of materials other than silicon. Thus, the terms "substrate" or "semiconductor substrate" should be understood to cover all semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

In general, and with reference to FIG. 1, the IC product 100 comprises a memory region 102 where one or more memory devices will be formed and a logic region (not shown) where one or more logic circuits (e.g., microprocessor circuits) will be formed in and above a semiconductor substrate (not shown in the attached figures). As is typical, the IC product 100 includes a plurality of metallization layers that constitute the overall wiring pattern for the IC product 100. These metallization layers may be formed on the IC product 100 by performing traditional manufacturing processes. These metallization layers are typically comprised of layers of insulating material (e.g., silicon dioxide, etc.) separated by etch stop layers (e.g., silicon nitride, etc.), wherein a plurality of conductive metal lines and/or conductive vias are formed in these layers of material. The conductive metal lines are routed across the substrate in various patterns and arrangements and provide the means for intra-layer electrical communication between the devices and structures formed on or above the substrate. The conductive vias provide the means for allowing electrical communication between the conductive metal lines in adjacent metallization layers. The first metallization layer of an IC product is typically referred to as the "M1" layer (or in some cases the "M0" layer), while the conductive vias that are used to establish electrical connection between the M1 layer and the conductive lines in the immediately adjacent upper metallization layer (the "M2 layer) are typically referred to as "V1" vias. So-called device level contacts (not shown) are formed above the substrate so as to provide electrical communication between the various active and passive semiconductor devices, e.g., transistors, resistors, etc., that are formed on or immediately adjacent the semiconductor substrate.

FIG. 1 depicts the IC product 100 after several process operations have been formed. More specifically, FIG. 1 depicts the product 100 at a point in time wherein an illustrative (and representative) metallization layer 105 has been formed above a semiconductor substrate (not shown). As will be appreciated by those skilled in the art after a complete reading of the present application, the metallization layer 105 is intended to be representative of any metallization layer (at any level) that may be formed on the IC product 100 irrespective of its vertical positon relative to an upper surface of the semiconductor substrate or any of the other metallization layers formed on the IC product 100. That is, the representative metallization layer 105 may be the M1 layer, the M4 layer, the M7 layer, etc.

With continued reference to FIG. 1, the IC product 100 is depicted at a point in time where a layer of insulating material 106 (e.g., silicon dioxide, a low-k material, etc.) for the representative metallization layer 105 has been formed above the semiconductor substrate. As noted above, the representative metallization layer 105 is intended to be representative of any metallization layer formed at any level on the IC product 100. In the example shown in FIG. 1, various illustrative conductive metal lines 108A-C (collectively referenced using the numeral 108) have been formed in the layer of insulating material 106 in the memory region 102 (as well as in the logic region (not shown)). The number, size, shape, configuration and overall routing of the metal lines 108 as well as the materials used in the representative metallization layer 105 may vary depending upon the particular application. In one example, the conductive metal lines 108 are elongated features that extend across the IC product 100 in a direction that is transverse to the plane of the drawing in FIG. 1, e.g., the elongated conductive metal lines 108 extend into and out of the plane of the drawing page. The metal lines 108 may be comprised of any of a variety of different conductive materials, e.g., copper, aluminum, tungsten, etc., and they may be formed by traditional manufacturing techniques, e.g., by performing a damascene process for cases where the conductive lines 108 are made of copper and perhaps by performing traditional deposition and etching processes when the conductive lines 108 are made of a conductive material that may readily be patterned using traditional masking and patterning (e.g., etching) techniques.

Figure 2:
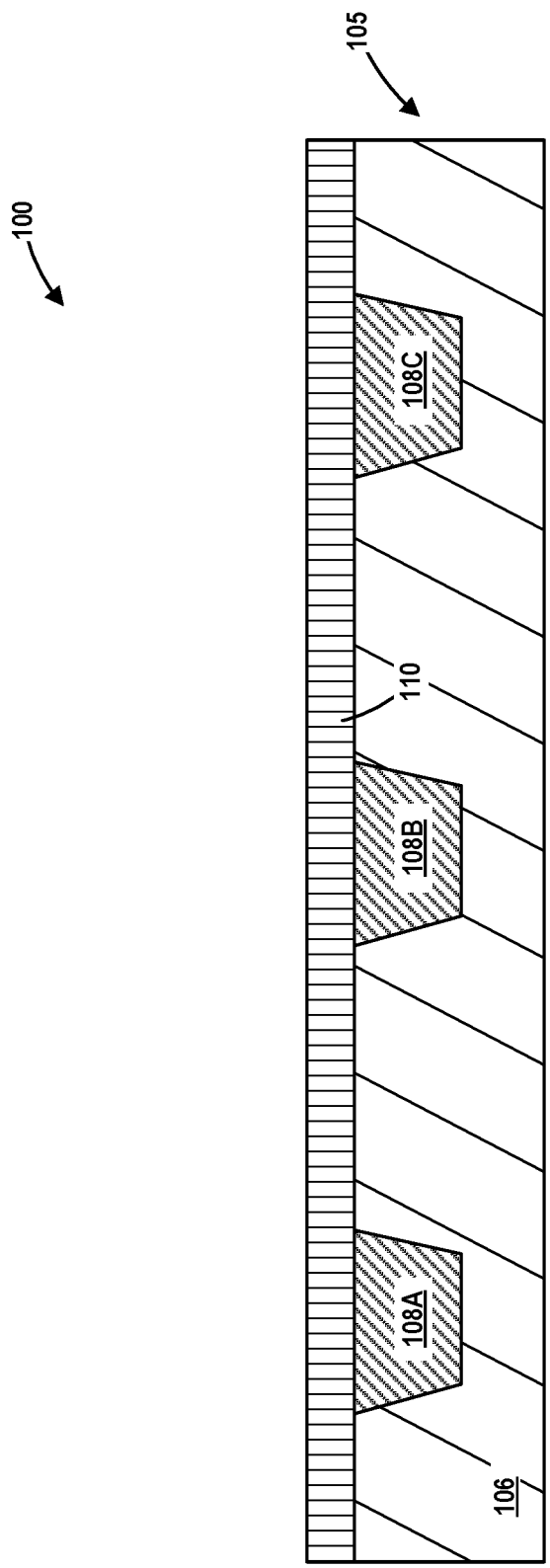

FIG. 2 depicts the IC product 100 after an etch stop layer 110 was formed above the layer of insulating material 106. The etch stop layer 110 may be comprised of a variety of different materials, e.g., silicon nitride, carbon-doped nitride (NDC), NBLK, advanced etch stop layers like AlN/ODC, etc. The thickness of the etch stop layer 110 may vary depending upon the particular application.

Figure 3:
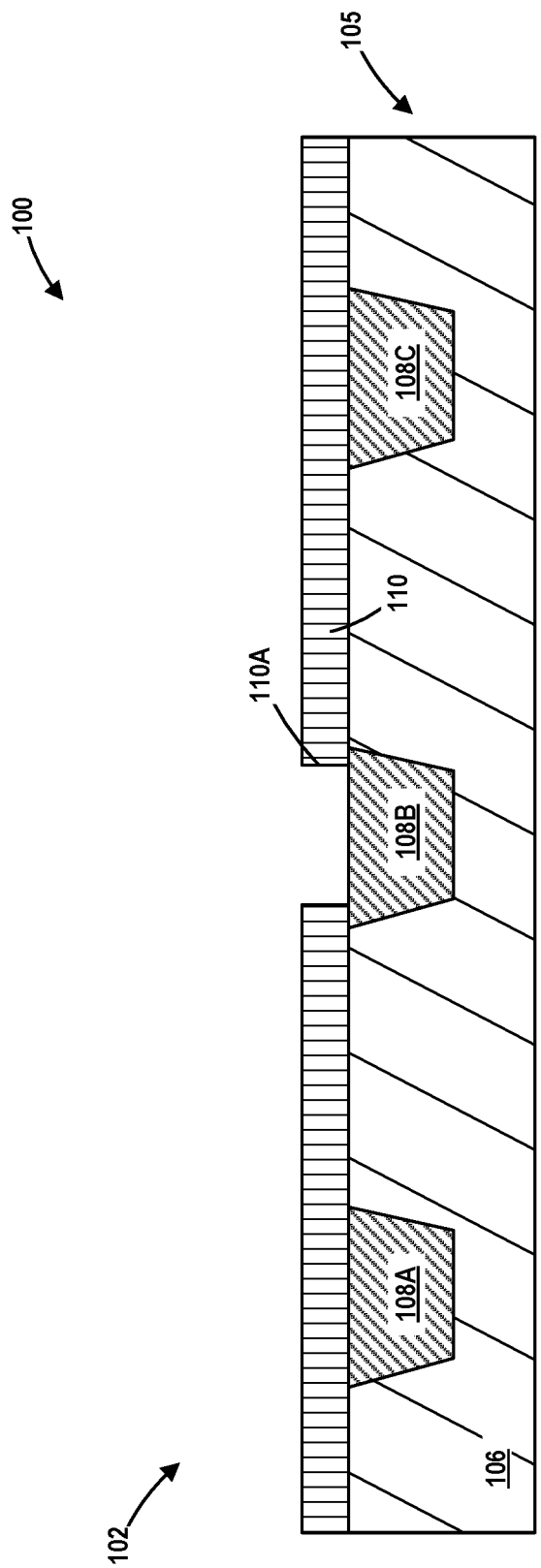

FIG. 3 depicts the IC product 100 after several process operations were performed. First, a first patterned etch mask (not shown), e.g., a patterned layer of photoresist, was formed on the product 100 above the etch stop layer 110. This particular patterned etch mask exposes portions of the etch stop layer 110 at locations in the memory region 102 where it is desired to establish electrical contact with the conductive lines 108, e.g., the conductive line 108B, formed in the layer of insulating material 106 within the memory region 102. At that point, an etching process was performed through the first patterned etch mask (not shown) so as to remove exposed portions of the etch stop layer 110 so as to thereby form a contact opening 110A that extends through the etch stop layer 110 and thereby expose at least a portion of the upper surface of the conductive line 108B. At that point, the first patterned etch mask may be removed.

Figure 4:
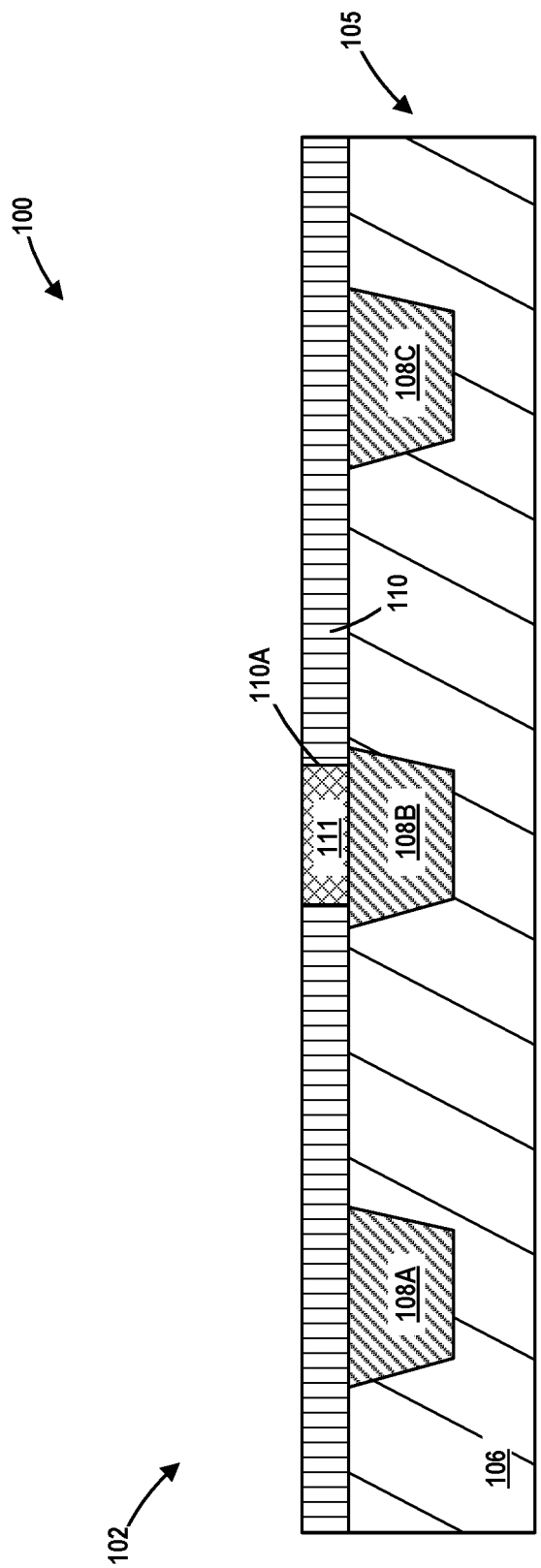

FIG. 4 depicts the IC product 100 after a representative conductive via 111 was formed in the opening 110A in the etch stop layer 110 using traditional manufacturing processing techniques, e.g., by performing a deposition process so as to overfill the opening 110A with conductive material(s), followed by performing a chemical mechanical planarization (CMP) process or etch-back operation to remove the excess amounts of the conductive material(s) for the conductive via 111 that are positioned on or above the upper surface of the etch stop layer 110. In one illustrative embodiment, when viewed from above, the conductive via 111 may have a substantially circular configuration. In other situations, the conductive via 111 may have a substantially oval configuration. The vertical thickness of the illustrative via 111 may vary depending upon the particular application, and it may be comprised of a variety of conductive materials, e.g., copper, tungsten, aluminum, etc. The conductive via 111 may be comprised of the same material of construction as that of the conductive metal line 108B to which it is conductively coupled, but that may not be the case in all applications. Of course, as will be appreciated by those skilled in the art after a complete reading of the present application, various barrier layers or liner layers (neither of which are shown) may be formed as part of the process of forming the illustrative conductive lines 108 and the conductive via 111. Moreover, various additional conductive structures that will be formed on the IC product 100, as discussed more fully below, may or may not include such illustrative barrier layers and/or liner layers, which are not depicted so as to not overly complicate the attached drawings.

Figure 5:
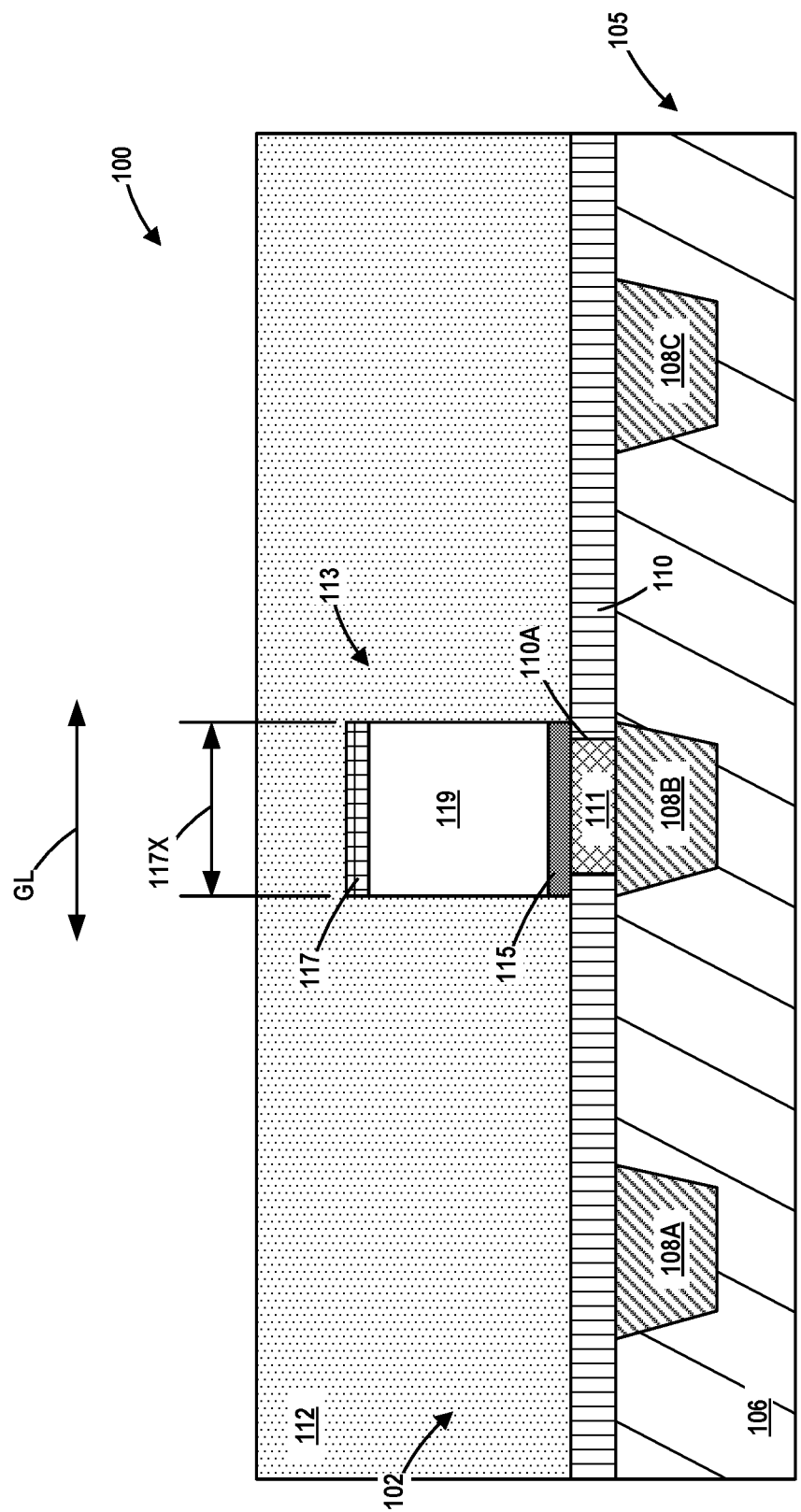

FIG. 5 depicts the IC product 100 after several process operations were performed to form an illustrative and representative embedded memory cell 113 in one or more layers of simplistically depicted and representative insulating material 112 by performing traditional manufacturing techniques. As will be appreciated by those skilled in the art after a complete reading of the present application, the present disclosure is directed to the formation of a conductive contact structure to a simplistically-depicted top electrode 117 of the embedded memory cell 113 on the IC product 100. The memory cell 113 depicted herein is intended to be generic and representative in nature. By way of example only, and not by way of limitation, the generic memory cell 113 depicted herein may take a variety of forms, have a variety of different configurations and may comprise different materials. For example, the cell 113 depicted herein may be an MTJ (magnetic tunnel junction) memory device, an RRAM (resistive random access memory) device, a PRAM (phase-change random access memory) device, an MRAM (magnetic random access memory) device, a FRAM (ferro-electric random access memory) device, etc. Additionally, in some applications, different types of such memory cells 113 may be formed on the same IC product 100. Such a memory cell 113 includes some form of memory state material 119 that is typically positioned between a simplistically-depicted bottom electrode 115 and the top electrode 117. As depicted, the bottom electrode 115 of the memory cell 113 is conductively coupled to the via 111 and ultimately the conductive line 108B. In some applications, some characteristic of the memory state material 119, e.g., resistivity, may be altered by the application of an electrical charge to the memory cell 113, and these altered states may be representative of a logical "1" or a logical "0" in a digital circuit. In some situations, the memory state material 119 may actually store an electrical charge. In any event, sensing circuitry on the IC product 100 may be used to sense the state of the memory state material 119, to determine whether or not a particular memory cell 113 represents a logical "1" or a logical "0" and use that information within the various circuits on the IC product 100. The particular materials used for the memory state material 119 may vary depending upon the particular type of memory cell 113 that is fabricated. Moreover, the single layer of memory state material 119 depicted in the drawings is intended to be representative in that, in a real-world device, the memory state material 119 may comprise a plurality of layers of material. Thus, the reference to any "memory state material" in the specification and in the attached claims should be understood to cover any form of any material(s) that may be employed on any form of a memory cell 113 that can be manipulated or changed so as to reflect two opposite logical states of the memory cell 113.

With continued reference to FIG. 5, and as noted above, the insulating material 112 is intended to be representative of one or more layers of insulating material (silicon dioxide, low-k materials) and/or etch stop layers (e.g., silicon nitride, etc.) that may be formed as part of the processes used to form the representative memory cell 113. The exact process flow performed to form the memory cell 113 may depend upon the particular type or form of memory cell 113 that will be constructed. Ultimately, at some point after the formation of the top electrode 117 of the memory cell 113, an insulating material, such as silicon dioxide, will be formed so as to cover the top electrode. In that sense, the insulating material 112 positioned above the top electrode 117 may be considered to be a layer of insulating material (e.g., silicon dioxide). Thus, the layer of insulating material 112 may be comprised of a variety of different insulating materials, e.g., silicon dioxide, TEOS, ultra low-k materials, OMCTS, densified ULK, etc., and its vertical thickness may vary depending upon the particular application.

Figure 6:
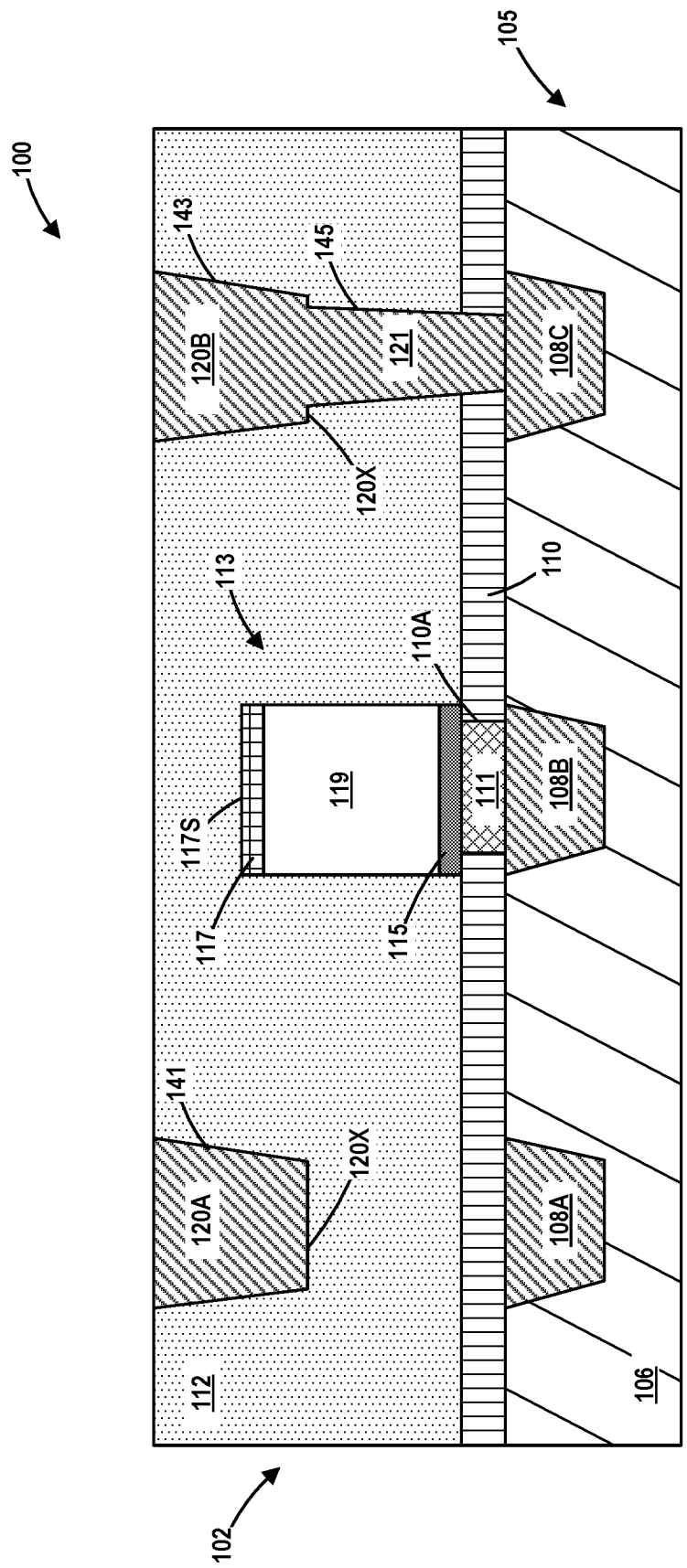

FIG. 6 depicts the IC product 100 after several process operations were performed to form conductive lines 120A-B (collectively referenced using the numeral 120) in trenches 141, 143, respectively, and a conductive via 121 in a via 145 formed in the insulating material(s) 112. As depicted, the conductive via 121 is conductively coupled to the conductive line 120B and the conductive line 108C. The conductive lines 120 and the conductive via 121 may be formed by performing traditional etching and deposition techniques that are well known to those skilled in the art. The conductive lines 120 and the conductive via 121 may be comprised of the same material(s) of construction as that of the conductive metal lines 108 described above, but that may not be the case in all applications.

Figure 7:
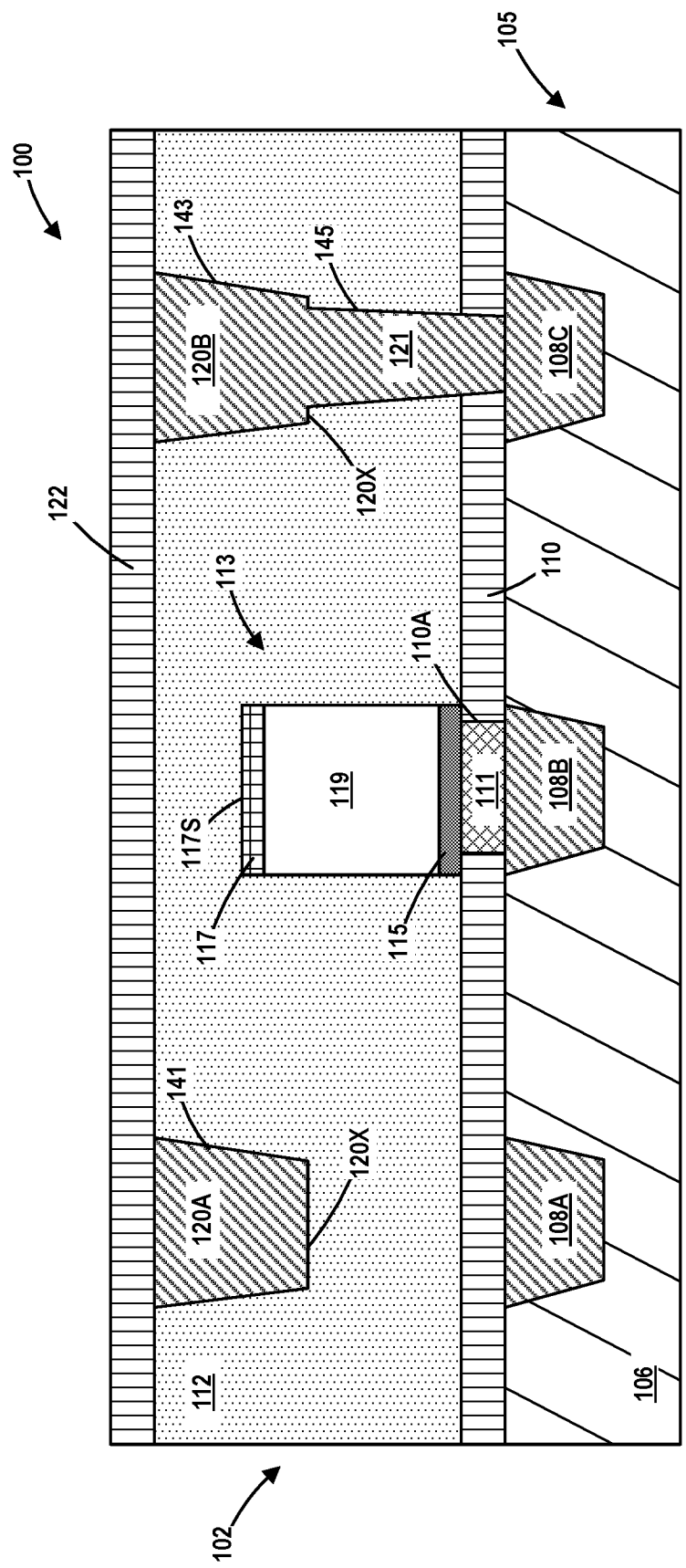

FIG. 7 depicts the IC product 100 after another etch stop layer 122 (that may be substantially similar to the above-described etch stop layer 110) was formed above the layer(s) of insulating material 112. The etch stop layer 122 may be comprised of a variety of different materials including those set forth above for the above-described etch stop layer 110. As before, the thickness of the etch stop layer 122 may vary depending upon the particular application.

Figure 8:
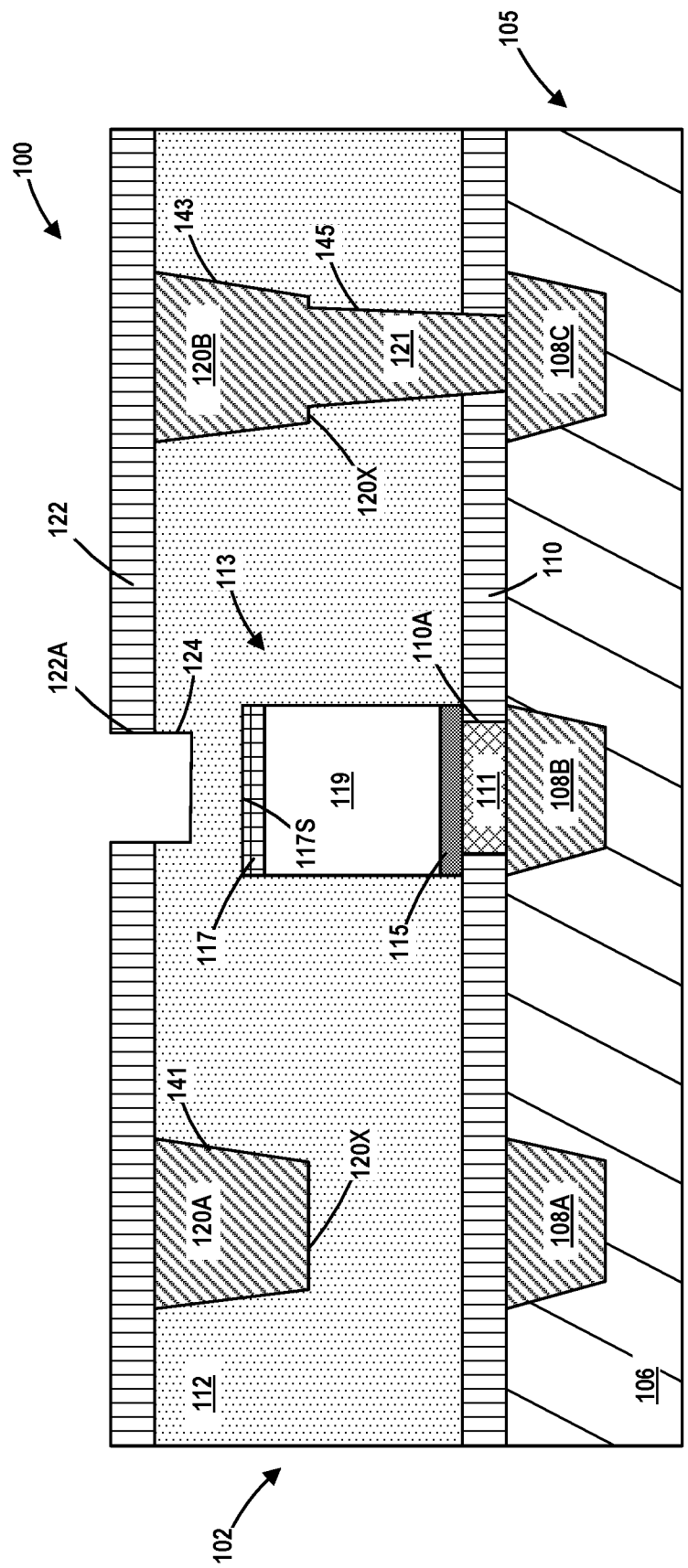

FIG. 8 depicts the IC product 100 after several process operations were performed. First, a second patterned etch mask (not shown), e.g., a patterned layer of photoresist, was formed on the product 100 above the etch stop layer 122. This particular patterned etch mask exposes portions of the etch stop layer 122 at locations in the memory region 102 where it is desired to establish electrical contact with the top electrode 117 of the memory cell 113. At that point, an etching process was performed through the second patterned etch mask (not shown) so as to remove exposed portions of the etch stop layer 122 thereby forming the opening 122A in the etch stop layer 122. This etching process involves some degree of over-etching so as to insure complete removal of the exposed portion of the etch stop layer 122 at the location of the opening 122A. As a result, a relatively shallow recess 124 may be formed in the uppermost portion of the layer(s) of insulating material 112 above the top electrode 117. The depth of the recess 124 may vary depending on the particular application. At that point, the second patterned etch mask may be removed.

Figure 9:
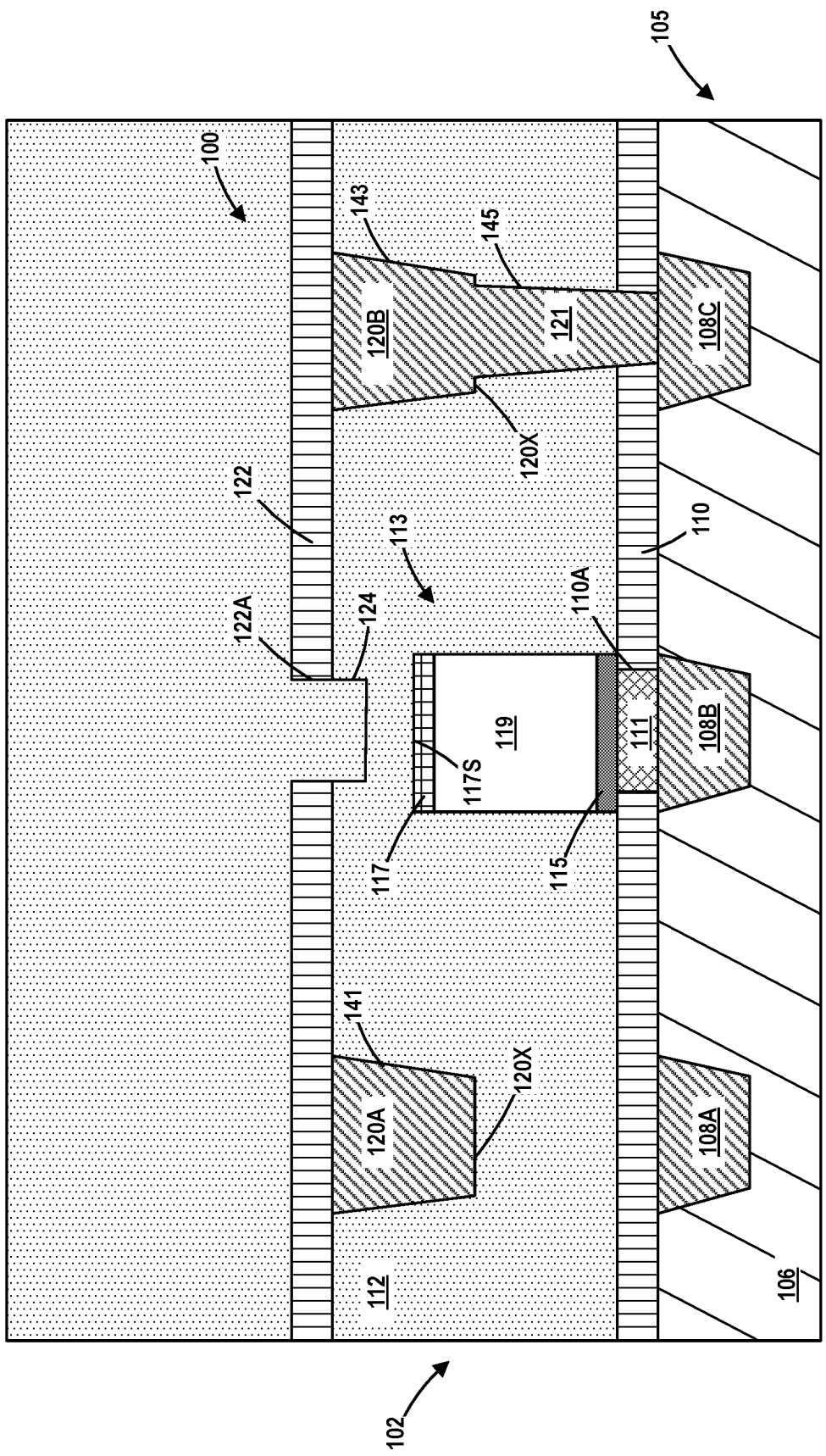

FIG. 9 depicts the IC product 100 after another layer or layers of the above-described representative insulating material 112 was formed above the patterned etch stop layer 122 by performing traditional manufacturing techniques. As noted above, the representative insulating material 112 added in FIG. 9 may be comprised of the same or different materials as those present in any of the other representative insulating materials 112 shown above.

Figure 10:
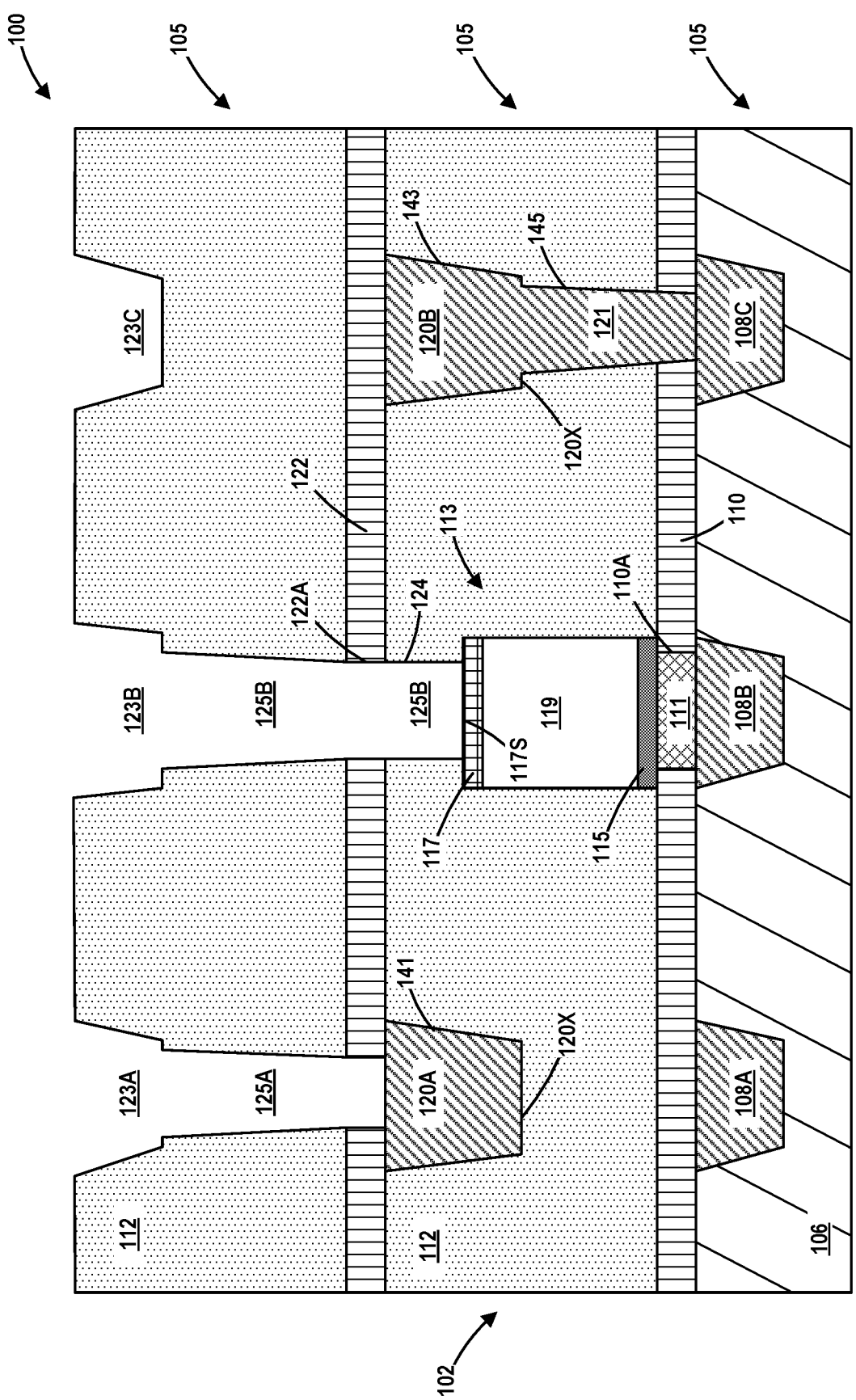

FIG. 10 depicts the IC product 100 after several process operations were performed to form a plurality of trenches 123A-C (collectively referenced using the numeral 123) and a plurality of vias 125A-B) (collectively referenced using the numeral 123). As will be appreciated by those skilled in the art, the trenches 123 and vias 125 may be formed using a variety of known masking and etching techniques (e.g., via first-trench last or trench first-via last) that typically involves the formation of two separate patterned etch masks—one to from the trenches 123 and one to form the vias 125. It should be noted that the via 125A exposes the underlying conductive line 120A while the via 125B exposes at least a portion of the top electrode 117 of the memory cell 113. Each of the trenches 123A-C is formed for a conductive line (not shown) that will be positioned in the layer(s) of insulating material 112. FIG. 10 depicts the IC product 100 at some point after the last of the patterned etch masks that was using in forming the trenches 123 or vias 125 was removed.

Figure 11:
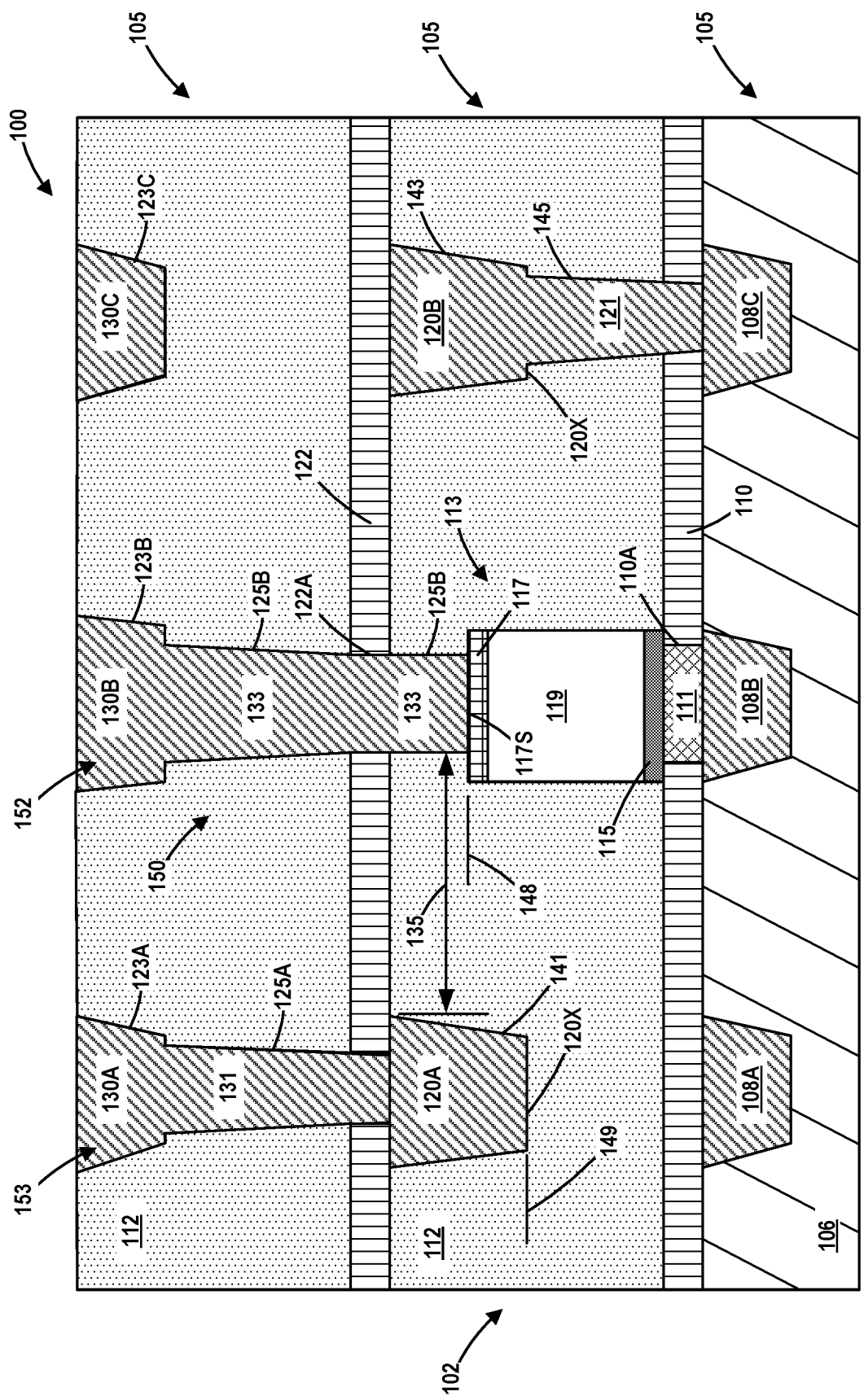

FIG. 11 depicts the IC product 100 after several process operations were performed to form conductive lines 130A-C (collectively referenced using the numeral 130) in the trenches 123A-C and to form conductive vias 131 and 133 in the vias 125A, 125B, respectively, formed in the insulating material(s) 112 and the etch stop layer 122. As will be appreciated by those skilled in the art after a complete reading of the present application, in the example depicted in FIG. 11, the combination of the trench 123B, the via 125B and the opening 122A in the etch stop layer 122 defines a conductive contact opening 150 that, when fully formed, exposes a portion of the upper surface 117S of the top electrode 117. Similarly, in the depicted example, the combination of the conductive line 130B and the conductive via 133 that extends through the etch stop layer 122 defines a conductive contact structure 152 that is positioned in the conductive contact opening 150, wherein the conductive contact structure 152 is conductively coupled to the top electrode 117 of the memory cell 113. In the depicted example, the conductive via portion of the conductive contact structure 152 physically contacts the upper surface 117S of the top electrode. The combination of the conductive line 130A and the conductive via 131 that extends through the etch stop layer 122 constitutes another conductive contact structure 153 which, as depicted, is conductively coupled to the conductive line 120A. The conductive line 130C is formed in the insulating material 112 at a location that is approximately vertically above the conductive line 120B. Of course, as will be appreciated by those skilled in the art, the conductive contact structure 152 could take other forms as well. For example, in some application, the conductive line 130B portion of the conductive contact structure 152 may be omitted and the via 125B may extend to the upper surface of the uppermost insulating material(s) layer 112 shown in FIG. 11. In this particular example, the conductive contact structure 152 would only comprise the conductive via 133. Of course, the conductive contact opening 150 would have a configuration that substantially corresponds to the overall configuration of the conductive contact structure 152. With continued reference to FIG. 11, in the depicted example, the top electrode 117 has a first lateral width 117X (see FIG. 5) in the gate length (GL) direction of a transistor (not shown) that was formed on the IC product, and the conductive contact structure 152, at a location where the conductive contact structure 152 physically contacts the upper surface 117S of the top electrode, has a second lateral width in the gate length direction that is less than the first lateral width 117X.

The conductive lines 130 and the conductive vias 131 and 133 may be formed by performing traditional etching and deposition techniques that are well known to those skilled in the art. The conductive lines 130 and the conductive vias 131 and 133 may be comprised of the same material(s) of construction as that of the conductive lines 120 and the conductive via 121 or the above-described conductive metal lines 108, but that may not be the case in all applications.

As will be appreciated by those skilled in the art after a complete reading of the present application, forming the conductive via 133 to the top electrode 117 using the methods disclosed herein provides significant advantages relative to forming such conductive vias to the top electrode of a memory cell using known prior art techniques. For example, using the novel techniques disclosed herein, the lateral (left to right) spacing 135 between the conductive via 133 and the nearest conductive line, e.g., the conductive line 120A, within the same metallization layer 105 and below the etch stop layer 122 is greater (throughout the vertical height of the conductive line 120A) as compared to corresponding lateral spacing in prior art structures. As depicted, due to the formation of the opening 122A in the etch stop layer 122, the formation of the lower portion of the via 125B (see FIG. 10 as well) below the etch stop layer 122 is essentially a self-aligned process that is controlled by the location of the opening 122A in the etch stop layer 122. As a result, there is much greater precision with respect to accurate lateral positioning of the lower portion of the conductive via 133 that extends below the bottom of the etch stop layer 122. Thus, the methods disclosed herein provide device manufacturers with a greater process window as it relates to the positioning of the patterned etch mask that is used to form the conductive via 133 and reduces the chances of undesirable and perhaps fatal electrical shorts between the conductive via 133 and the nearest adjacent conductive line(s), e.g., the conductive line 120A, within the same metallization layer.

Additionally, with continued reference to FIG. 11, in one illustrative embodiment, the upper surface 117S of the top electrode 117 is positioned at a first level 148 that is above a level 149 of a bottom surface 120X of the conductive line 120 that is nearest the memory cell 113 and positioned within the same metallization layer 105. This vertical spacing difference between the level 148 of the upper surface 117S of the top electrode 117 and the level 149 of the lower surface 120X of the conductive line(s) 120 may be determined with respect to any common reference surface below the metallization layer 105 that contains the memory cell 113. Such a reference surface may be, for example, an upper surface of an underlying semiconductor substrate (not shown) or an upper surface of an underlying metallization layer. In some embodiments, the level 148 may be at approximately the same level as that of the level 149, e.g., the vertical spacing between the levels 148 and 149 would be approximately zero. The magnitude of the vertical spacing difference between the levels 148 and 149 may vary depending upon the particular application. In one illustrative embodiment, the magnitude of the vertical spacing between the levels 148 and 149 may be about 0-15 nm. The positioning of the level 148 of the upper surface 117S of the top electrode 117 even with or above the level 149 of the bottom surface 120X of the conductive lines 120 may be beneficial in that it will help in the formation of the memory cells 113 in metallization layers that include conductive structures formed with relatively tighter pitches and smaller via heights.

Figure 12:
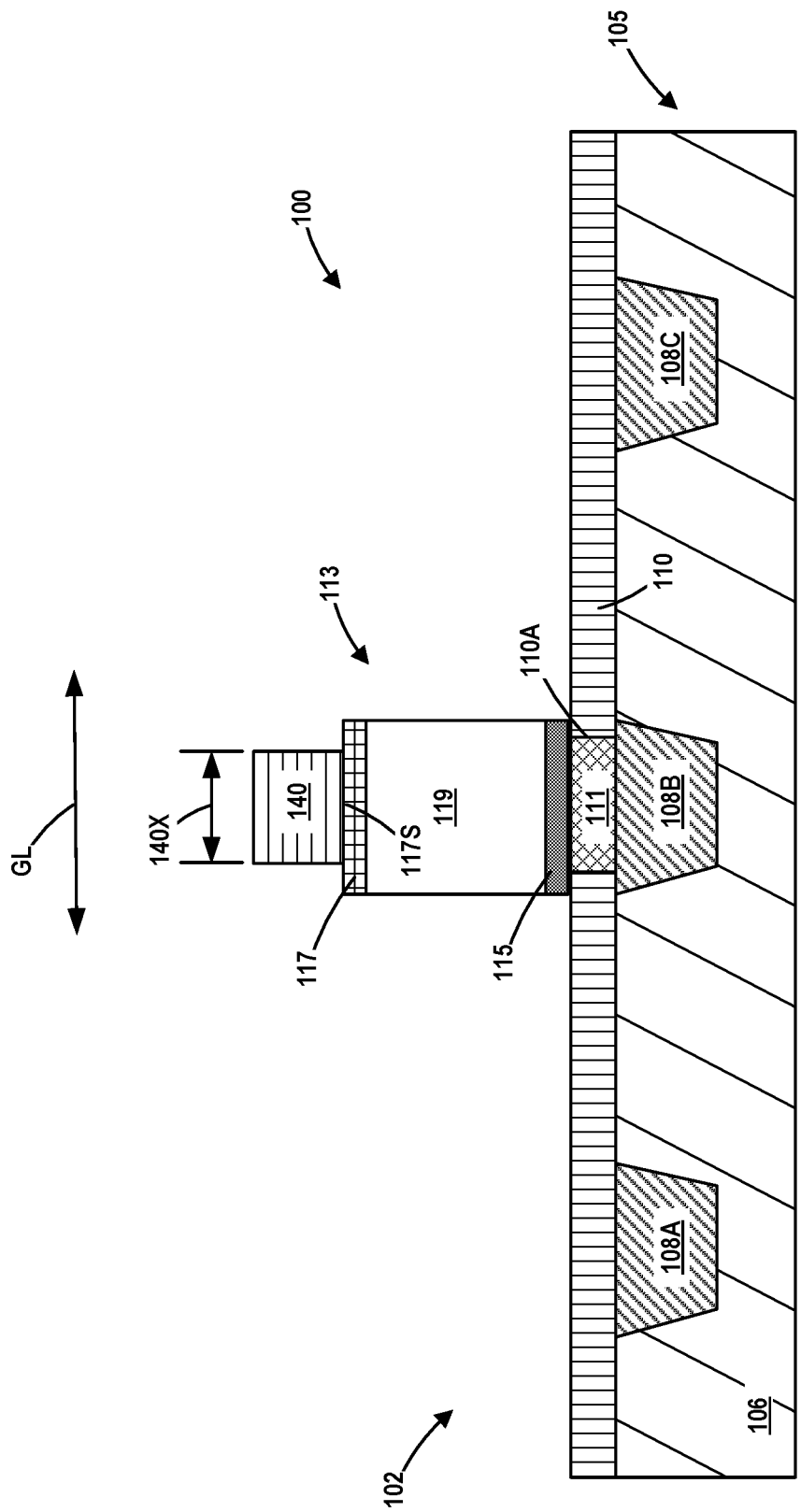
FIGS. 12-18 depict another illustrative method of forming one illustrative embodiment of a novel conductive contact structure that is conductively coupled to a top electrode of an embedded memory device on an IC product.

FIGS. 12-18 depict another illustrative method of forming one illustrative embodiment of a novel conductive contact structure that is conductively coupled to the top electrode 117 of the above-described embedded memory device 113 on an IC product 100. FIG. 12 depicts the IC product 100 after the formation of the above-described memory cell 113 above the conductive via 111 formed in the opening 110A of the etch stop layer 110. However, unlike the previous example, in this embodiment, the method involves the formation of a layer of sacrificial material 140 above the upper surface of the top electrode 117 of the memory cell 113. In this example, the layer of sacrificial material 140 covers less than an entirety of the upper surface 117S of the top electrode 117. The layer of sacrificial material 140 may be comprised of a variety of different materials that may be selectively removed relative to surrounding structures including, for example, the memory cell 113 and the insulating material(s) 112. In one illustrative embodiment, the layer of sacrificial material 140 may be, e.g., an ERF (Energy Removal Film) material. The layer of sacrificial material 140 may be formed to any desired thickness. Moreover, the layer of sacrificial material 140 may be formed by any known method, e.g., known deposition and patterning techniques, selective deposition techniques, etc. As depicted, in one illustrative embodiment, the layer of sacrificial material 140 may have a lateral width 140X (in a direction corresponding to the gate length direction (GL) of various transistor devices (not shown) formed on the IC product 100. As noted above, in this example, the lateral width 140X of the layer of sacrificial material 140 is less than the lateral width 117X (see FIG. 5) of the top electrode 117.

Figure 13:
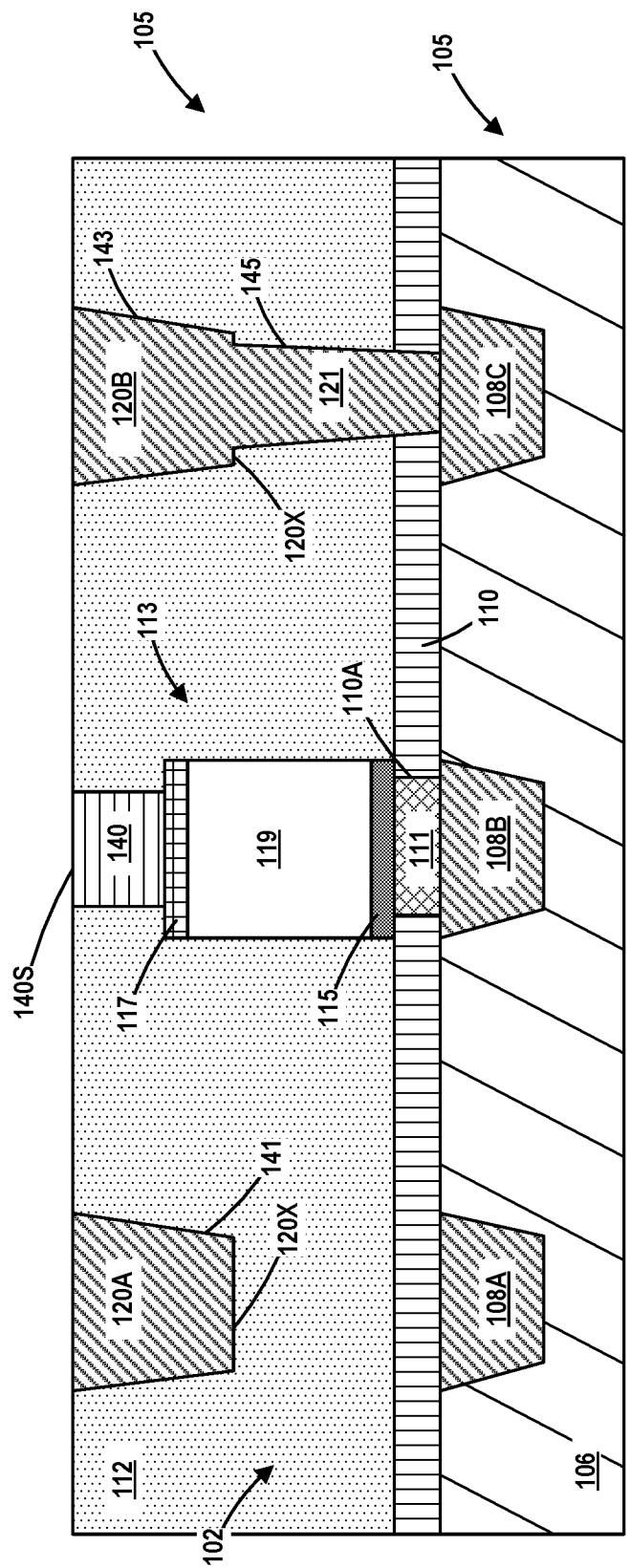

FIG. 13 depicts the product after several process operations were performed. First, a layer(s) of insulating material 112 was formed above the etch stop layer 110 and above the upper surface 140S of the layer of sacrificial material 140. At that point, one or more CMP or etch-back process operations were performed so as to planarize the upper surface of the insulating material 112. These process operations expose the upper surface 140S of the layer of sacrificial material 140. Thereafter, various known etching and deposition processes were performed to form the above-described conductive lines 120A-B (collectively referenced using the numeral 120) in the trenches 141, 143, respectively, and the above-described conductive via 121 in the via 145 in the latest layers of insulating material(s) 112.

Figure 14:
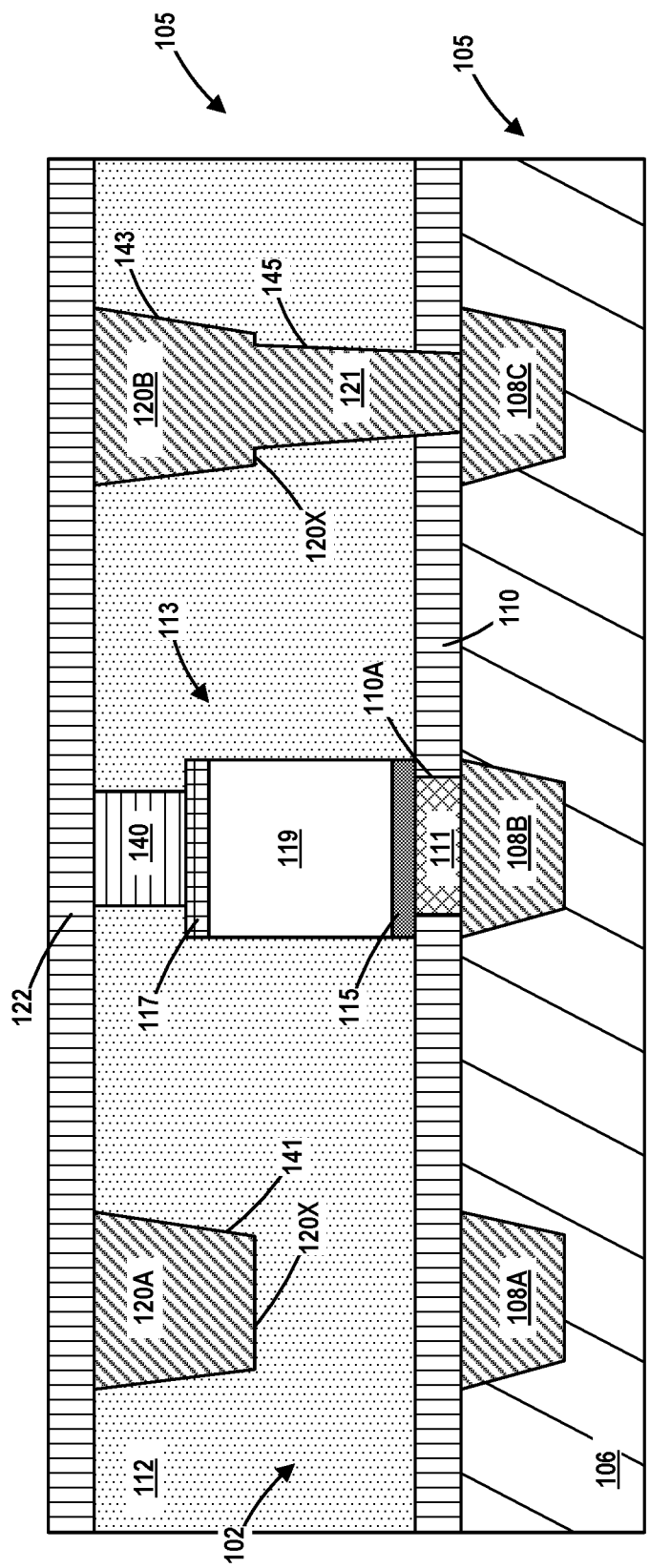

FIG. 14 depicts the IC product 100 after the above-described etch stop layer 122 was formed on the IC product 100.

Figure 15:
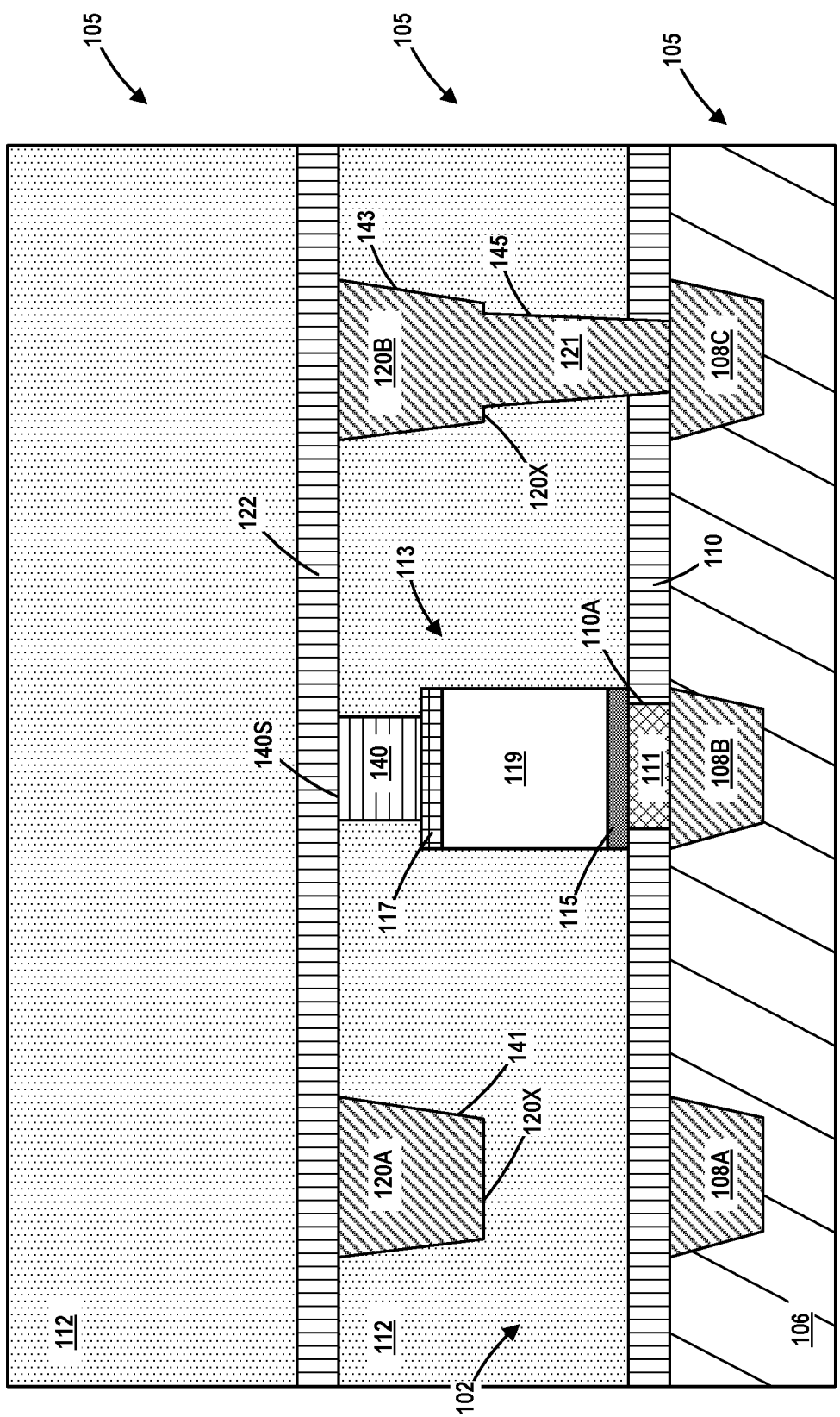

FIG. 15 depicts the IC product 100 after another layer or layers of the above-described representative insulating material 112 was formed above the above-described etch stop layer 122 by performing traditional manufacturing techniques.

Figure 16:
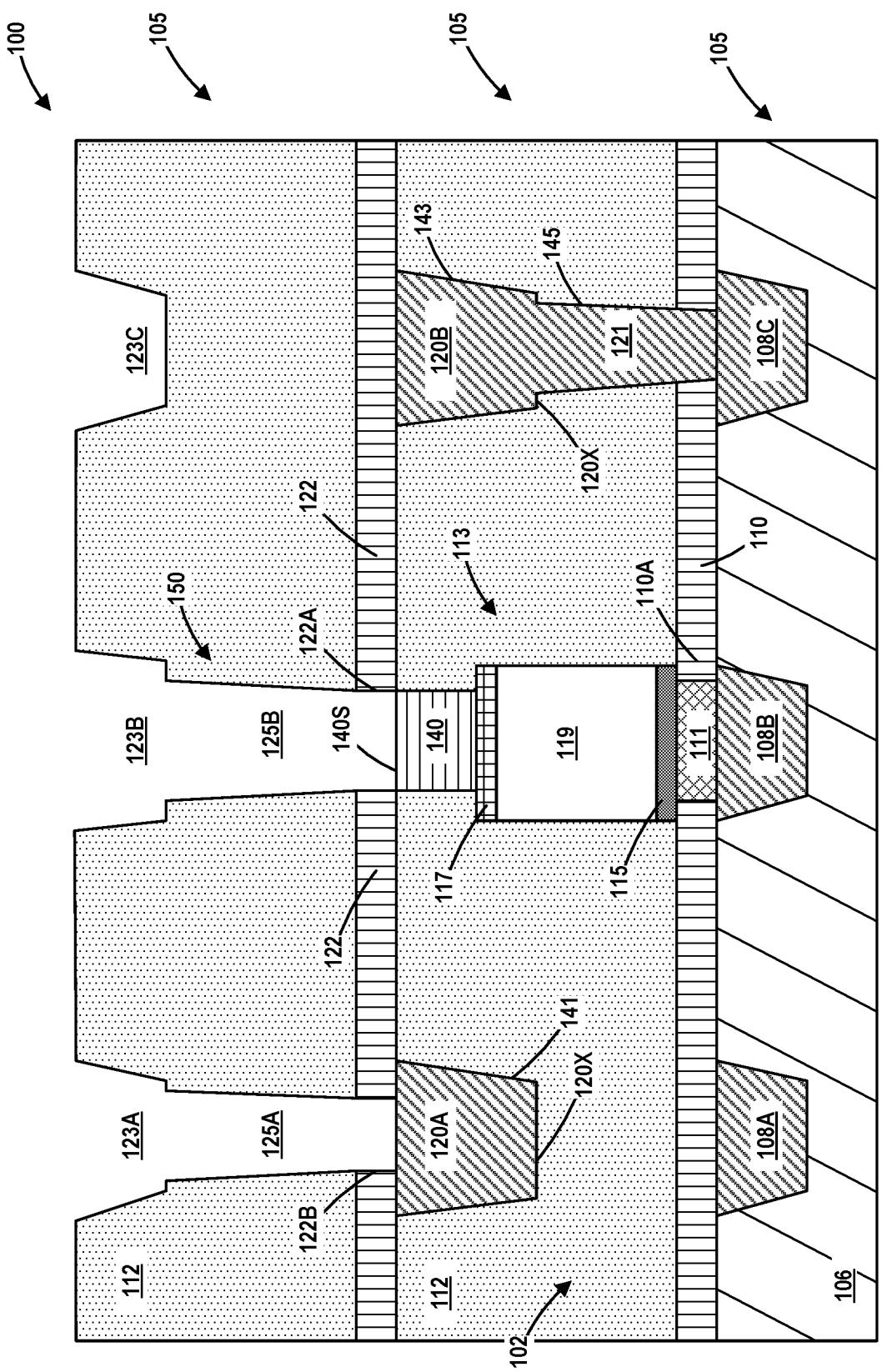

FIG. 16 depicts the IC product 100 after several masking and etching process operations were performed to form the above-described plurality of trenches 123A-C and the above-described plurality of vias 125A-B in the most recent layer(s) of insulating material 112 and to also form the above-described openings 122A-B in the etch stop layer 122, respectively. As before, the trenches 123, vias 125 and the openings 122A-B, may be formed using a variety of known masking and etching techniques (e.g., via first-trench last or trench first-via last) that typically involves the formation of two separate patterned etch masks—one to form the trenches 123 and one to form the vias 125. It should be noted that the via 125A exposes the underlying conductive line 120A while the via 125B exposes at least a portion of the upper surface 140S of the layer of sacrificial material 140 that is positioned above the top electrode 117 of the memory cell 113. It should be noted that, at this point, the trench 123B, the via 125B and the opening 122A in the etch stop layer 122 define a portion of what will ultimately become the conductive contact opening 150. As before, the trenches 123A-C are each formed for a conductive line (not shown) that will be positioned in the layer(s) of insulating material 112. FIG. 16 depicts the IC produce 100 at some point after the last of the patterned etch mask that was using in forming the trenches 123 or vias 125 was removed.

Figure 17:
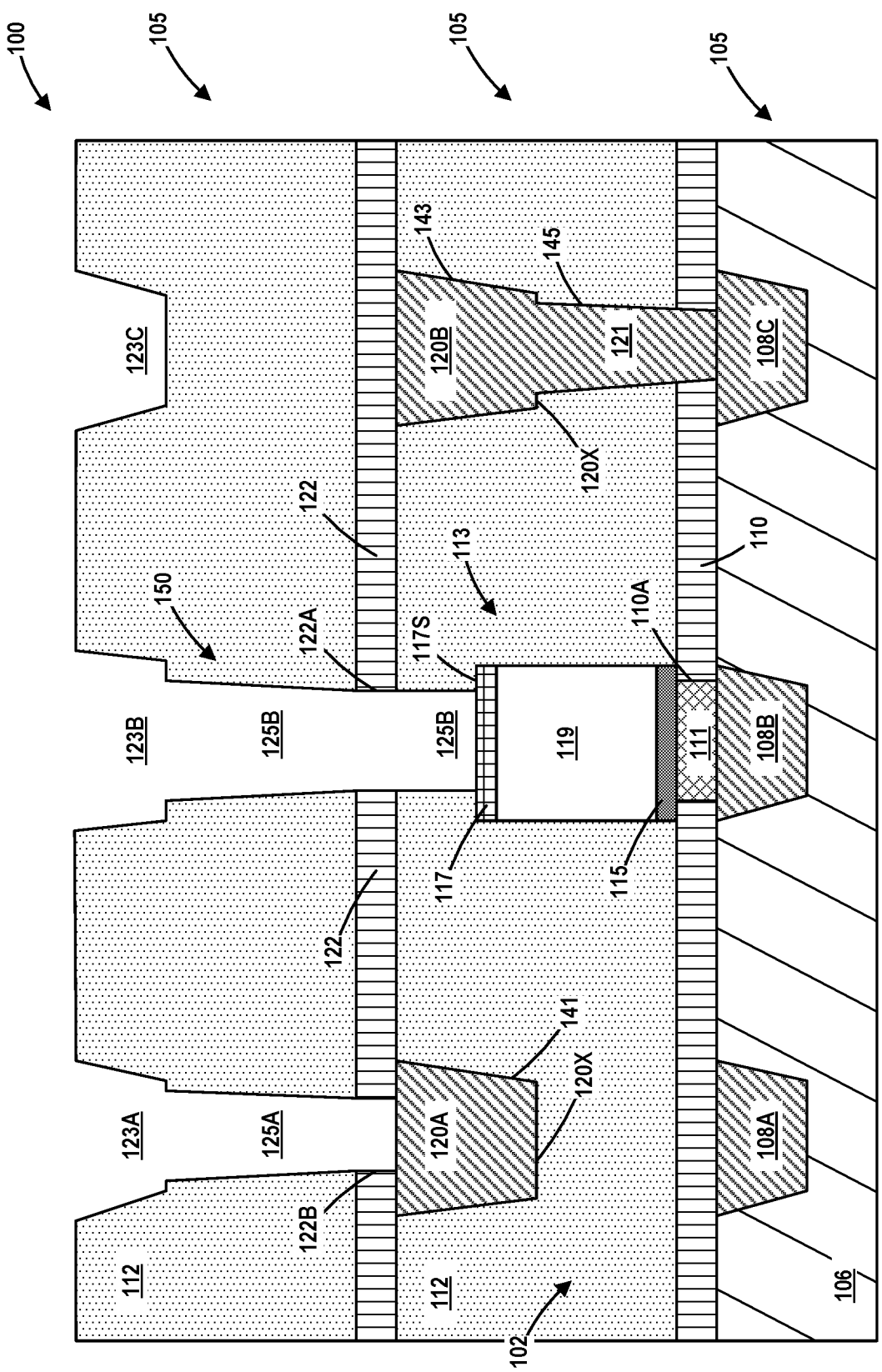

FIG. 17 depicts the IC product 100 after a UV curing process was performed through the via 123B to selectively remove the layer of sacrificial material 140 relative to surrounding materials. This process operation exposes the upper surface 117S of the top electrode 117 and extends the depth of the via 125B (and the conductive contact opening 150). In one illustrative embodiment, this process operation removes substantially the entire layer of sacrificial material 140 positioned above the upper surface 117S of the top electrode 117.

Figure 18:
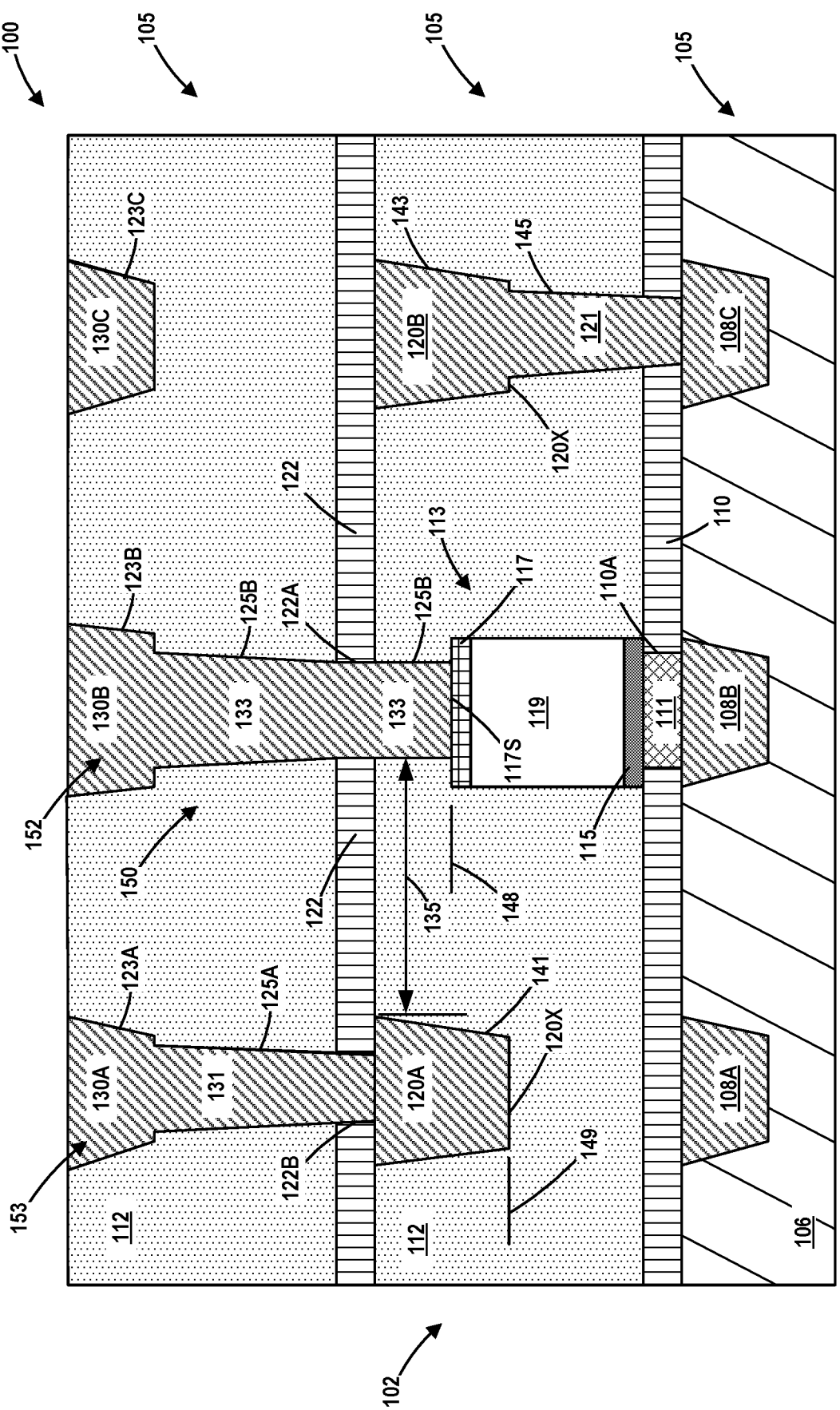

FIG. 18 depicts the IC product 100 after several process operations were performed to form the above-described conductive contact structure 152 in the depicted conductive contact opening 150. As depicted, in this example, the conductive contact structure 152, e.g., the combination of the conductive line 130B and the conductive via 133, extends through the etch stop layer 122 and is conductively coupled to the top electrode 117 of the memory cell 113. As before, the conductive line 130C is formed in the insulating material 112 at a location that is approximately vertically above the conductive line 120B. Note that, in this example, the upper surface 117S of the top electrode 117 has a first lateral width 117X (see FIG. 5) in the gate length (GL) direction and the conductive contact structure 152, at a location where the conductive contact structure 152 physically contact the upper surface 117S of the top electrode 117, has a second lateral width in the gate length direction that is less than the first lateral width 117X of the upper surface 117S of the top electrode 117.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit product, comprising:
   a first metallization layer having a first insulating layer, a second insulating layer over the first insulating layer, and an etch stop layer over the first insulating layer separating the first insulating layer from the second insulating layer,
   wherein the first insulating layer includes a first material that is substantially uniform throughout the first insulating layer, the second insulating layer includes a second material, and the etch stop layer includes a third material different than the first material and the second material;
   a memory cell positioned in the first insulating layer of the first metallization layer, the memory cell comprising an upper electrode having an upper surface that is positioned at a first level within the first metallization layer relative to a reference surface located below the first metallization layer, and a lower electrode that is positioned below the upper electrode within the first metallization layer relative to the reference surface,
   wherein the lower electrode is laterally surrounded by the first insulating layer from an upper surface of the lower electrode to a lower surface of the lower electrode,
   wherein the lower surface of the lower electrode is substantially coplanar with a lower surface of the first insulating layer;
   a conductive line positioned in the first metallization layer, the conductive line comprising a bottom surface that is positioned at a second level within the first metallization layer relative to the reference surface, wherein the first level is above the second level, and the second level is above the lower electrode relative to the reference surface; and
   a conductive contact structure that is conductively coupled to the upper surface of the upper electrode, wherein a portion of the conductive contact structure extends through the first insulating layer, the etch stop layer, and the second insulating layer.

2. The integrated circuit product of claim 1, wherein the memory cell comprises one of an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

3. The integrated circuit product of claim 1, wherein the integrated circuit product comprises at least one transistor device having a gate length that extends in a gate length direction, wherein the upper electrode has a first lateral width in the gate length direction and wherein the conductive contact structure, at a location where the conductive contact structure physically contacts the upper surface of the upper electrode, has a second lateral width in the gate length direction that is less than the first lateral width, wherein the conductive contact structure comprises at least one of copper, aluminum, or tungsten, and wherein the conductive contact structure comprises the conductive line and a conductive via, wherein the conductive via physically contacts the upper surface of the upper electrode.

4. The integrated circuit product of claim 1, wherein the upper electrode in the memory cell is separated from the etch stop layer.

5. The integrated circuit product of claim 1, wherein the third material of the etch stop layer comprises at least one of: silicon nitride, carbon-doped nitride (NDC), aluminum, or oxygen-doped silicon carbide (ODC), and wherein the first material of the first insulating layer and the second material of the second insulating layer comprise at least one of: silicon dioxide or a low-k material.

6. The integrated circuit product of claim 1, wherein the etch stop layer has a substantially uniform vertical thickness.

7. The integrated circuit product of claim 1, further comprising a second conductive contact structure that is conductively coupled to the lower surface of the lower electrode.

8. The integrated circuit product of claim 7, wherein the second conductive contact structure includes a conductive via physically contacting the lower surface of the lower electrode.

9. An integrated circuit product, comprising:
a first metallization layer;
a memory cell positioned in the first metallization layer, the memory cell comprising an upper electrode having an upper surface that is positioned at a first level within the first metallization layer relative to a reference surface located below the first metallization layer, and a lower electrode that is positioned below the upper electrode within the first metallization layer relative to the reference surface;
a conductive line positioned in the first metallization layer, the conductive line comprising a bottom surface that is positioned at a second level within the first metallization layer relative to the reference surface, wherein the first level is above the second level, and the second level is above the lower electrode relative to the reference surface; and
a conductive contact structure that is conductively coupled to the upper surface of the upper electrode, wherein the first metallization layer comprises a first insulating material layer positioned above the first level, an etch stop layer positioned above the first insulating material layer, and a second insulating material layer positioned over the etch stop layer, wherein a portion of the conductive contact structure extends through the first insulating material layer, the etch stop layer and the second insulating material layer, wherein the first insulating material layer includes a first material that is substantially uniform throughout the first insulating layer, wherein the conductive contact structure comprises the conductive line and a conductive via, wherein the conductive via physically contacts the upper surface of the upper electrode, and wherein the upper surface of the upper electrode is separated from the etch stop layer, wherein the lower electrode is laterally surrounded by the first insulating layer from an upper surface of the lower electrode to a lower surface of the lower electrode, wherein the lower surface of the lower electrode is substantially coplanar with a lower surface of the first insulating layer.

10. The integrated circuit product of claim 9, wherein the memory cell comprises one of: an RRAM (resistive random access memory) device, a PRAM (phase-change random access memory) device, an MRAM (magnetic random access memory) device, or a FRAM (ferroelectric random access memory) device.

11. The integrated circuit product of claim 9, wherein the upper surface of the upper electrode is positioned at the first level above the second level, wherein the bottom surface of the conductive line is positioned at the second level, and wherein the conductive line is a nearest conductive line to the memory cell within the first metallization layer.

12. The integrated circuit product of claim 11, wherein the first level and the second level are vertically spaced by up to 15 nanometers (nm).

13. The integrated circuit product of claim 9, wherein the conductive line is a nearest conductive line to the memory cell within the first metallization layer.

14. The integrated circuit product of claim 13, wherein the conductive contact structure comprises at least one of copper, aluminum, or tungsten.

15. The integrated circuit product of claim 13, wherein the etch stop layer comprises at least one of: silicon nitride, carbon-doped nitride (NDC), aluminum, or oxygen-doped silicon carbide (ODC), and wherein the insulating material comprises at least one of: silicon dioxide or a low-k material, and wherein the memory cell comprises one of: an RRAM (resistive random access memory) device, a PRAM (phase-change random access memory) device, an MRAM (magnetic random access memory) device, or a FRAM (ferroelectric random access memory) device.

16. The integrated circuit product of claim 9, wherein the etch stop layer has a substantially uniform vertical thickness.

* * * * *